United States Patent
Huber

(10) Patent No.: US 8,467,151 B1
(45) Date of Patent: Jun. 18, 2013

(54) DISK DRIVE COMPRISING AN INTERCONNECT WITH TRANSMISSION LINES FORMING AN APPROXIMATED LATTICE NETWORK

(75) Inventor: William D. Huber, Hollister, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 262 days.

(21) Appl. No.: 12/785,150

(22) Filed: May 21, 2010

(51) Int. Cl.
*G11B 5/48* (2006.01)

(52) U.S. Cl.
USPC .................. 360/246; 360/245.9; 360/264.2

(58) Field of Classification Search
USPC ............ 360/234.5, 245.8, 245.9, 246, 264.2, 360/266.3
See application file for complete search history.

(56) References Cited

U.S. PATENT DOCUMENTS

| | | | |
|---|---|---|---|
| 3,617,952 A | 11/1971 | Beech | |
| 4,344,093 A | 8/1982 | Huber | |
| 4,656,533 A | 4/1987 | Sakai et al. | |
| 5,184,095 A | 2/1993 | Hanz et al. | |
| 5,608,591 A | 3/1997 | Klaassen | |
| 5,717,547 A | 2/1998 | Young | |
| 5,737,152 A | 4/1998 | Balakrishnan | |
| 5,771,568 A | 6/1998 | Gustafson | |
| 5,796,552 A | 8/1998 | Akin, Jr. et al. | |
| 5,805,382 A | 9/1998 | Lee et al. | |
| 5,995,328 A | 11/1999 | Balakrishnan | |
| 6,144,981 A | 11/2000 | Kovacs et al. | |
| 6,249,404 B1 | 6/2001 | Doundakov et al. | |
| 6,275,358 B1 | 8/2001 | Balakrishnan et al. | |
| 6,331,919 B1 | 12/2001 | Klaassen et al. | |
| 6,356,113 B1 | 3/2002 | Contreras et al. | |
| 6,424,500 B1 | 7/2002 | Coon et al. | |
| 6,493,190 B1 | 12/2002 | Coon | |
| 6,603,623 B1 | 8/2003 | Fontana, Jr. et al. | |
| 6,608,736 B1 | 8/2003 | Klaassen et al. | |
| 6,714,385 B1 | 3/2004 | Even et al. | |
| 6,762,913 B1 | 7/2004 | Even et al. | |
| 6,891,700 B2 | 5/2005 | Shiraishi et al. | |
| 6,900,967 B1 | 5/2005 | Coon et al. | |
| 6,963,471 B2 * | 11/2005 | Arai et al. | 360/246 |
| 6,975,488 B1 | 12/2005 | Kulangara et al. | |
| 7,019,959 B2 * | 3/2006 | Chua | 361/329 |
| 7,092,215 B2 * | 8/2006 | Someya et al. | 360/246 |
| 7,142,073 B2 | 11/2006 | Kim et al. | |
| 7,180,011 B1 | 2/2007 | Hall et al. | |
| 7,359,149 B2 | 4/2008 | Kiyono et al. | |

(Continued)

OTHER PUBLICATIONS

Huber et al., "Advanced Interconnect Design for High Data Rate Perpendicular Magnetic Recording", IEEE Transactions on Magnetics, vol. 44, No. 1, pp. 175-180, Jan. 2008.

Klaassen et al., "Writing At High Data Rates", Journal of Applied Physics, vol. 93, No. 10, pp. 6450-6452, May 2003.

(Continued)

*Primary Examiner* — Jefferson Evans

(57) ABSTRACT

A disk drive is disclosed comprising a disk, a head actuated over the disk, a preamp, and an interconnect for coupling the head to the preamp. The interconnect comprises a first transmission line stacked with a second transmission line, and a dielectric between the first transmission line and second transmission line. The transmission lines form an approximation of at least one inductor/capacitor ladder network and an approximation of at least one inductor/capacitor lattice network. The lattice network comprises a first leg and a second leg, and a cross-over hub for interconnecting the first leg and the second leg.

6 Claims, 7 Drawing Sheets

U.S. PATENT DOCUMENTS

| | | | |
|---|---|---|---|
| 7,986,495 B2* | 7/2011 | Kamei et al. | 360/246 |
| 8,289,656 B1 | 10/2012 | Huber | |
| 2004/0252413 A1 | 12/2004 | Nishiyama | |
| 2005/0180053 A1* | 8/2005 | Dovek et al. | 360/246 |
| 2005/0280944 A1* | 12/2005 | Yang et al. | 360/245.9 |
| 2006/0044695 A1 | 3/2006 | Erpelding | |
| 2006/0092572 A1* | 5/2006 | Kiyono | 360/245.9 |
| 2006/0152854 A1 | 7/2006 | Arya et al. | |
| 2007/0178766 A1 | 8/2007 | Banerjee et al. | |
| 2008/0055788 A1 | 3/2008 | Nagai | |
| 2008/0273269 A1 | 11/2008 | Pro | |
| 2010/0157457 A1* | 6/2010 | Contreras et al. | 360/39 |
| 2011/0051292 A1 | 3/2011 | Huber | |

OTHER PUBLICATIONS

Matthaei et al. "Multiplexer Design", Microwave Filters, Impedance-Matching Networks, and Coupling Structures. Artech House Books, 1980. Ch. 16.

Scanlan et al. "Microwave Allpass Networks—Part I and Part II", IEEE Transactions on Microwave Theory and Techniques, vol. 16, No. 2, Feb. 1968, p. 62-79.

Yue Ping Zhang et al., "Dual-Band Microstrip Bandpass Filter Using Stepped-Impedance Resonators With New Coupling Schemes", IEEE Transactions on Microwave Theory and Techniques, vol. 54, No. 10, pp. 3779-3785, Oct. 2006.

\* cited by examiner

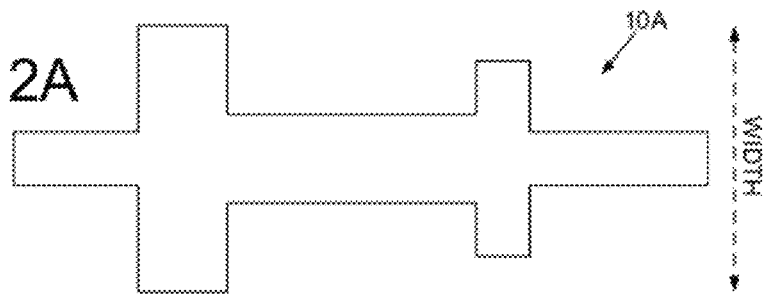
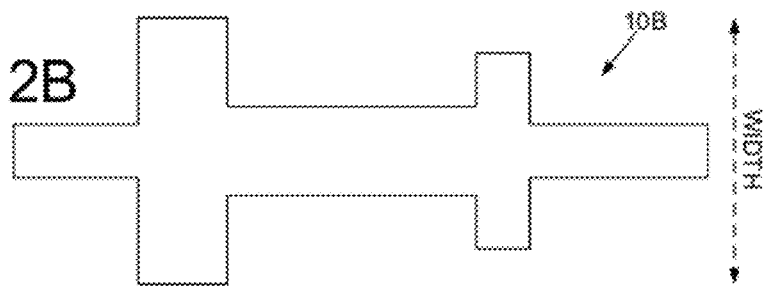
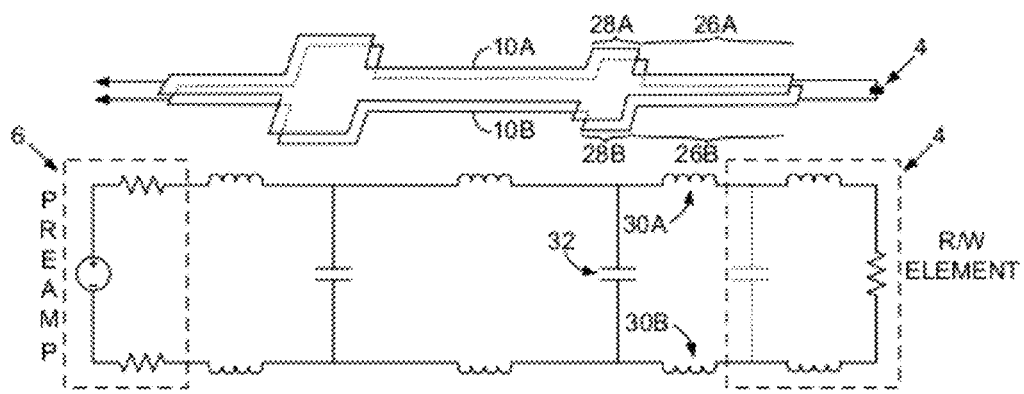

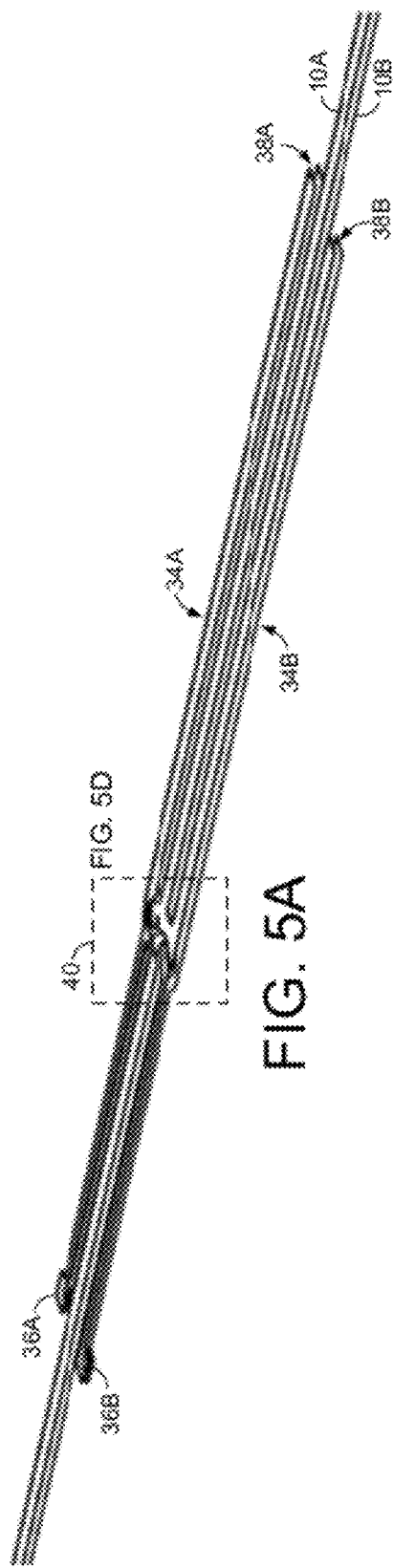

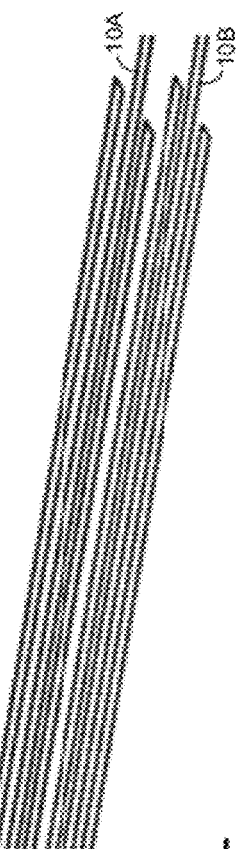
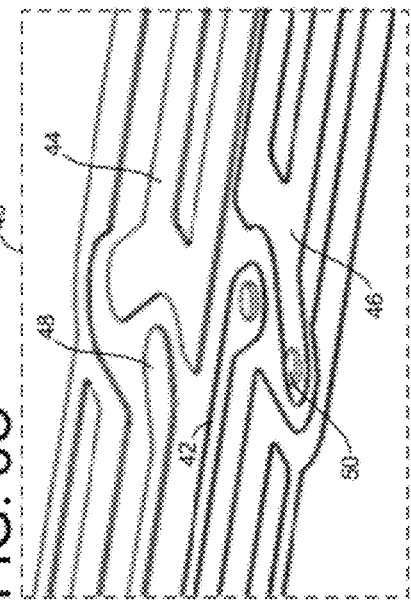
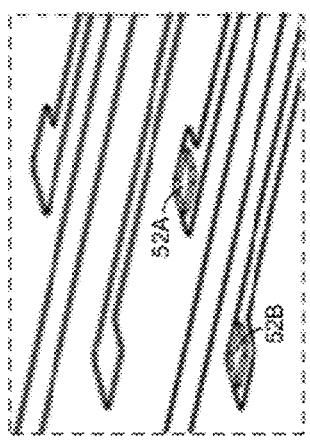
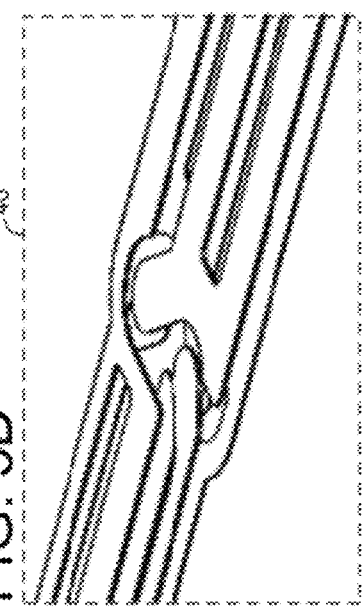

DISK DRIVE COMPRISING AN INTERCONNECT WITH TRANSMISSION LINES FORMING AN APPROXIMATED LATTICE NETWORK

BACKGROUND

Description of the Related Art

The head in a disk drive is typically mounted on a slider attached to the end of a suspension. The suspension is attached to a distal end of an actuator arm which is rotated about a pivot by a voice coil motor (VCM) in order to actuate the head radially over the disk. The suspension is fabricated with traces (e.g., copper traces) which act as transmission lines that carry the write/read signals between the head and a preamp. It is important to fabricate the traces so as to optimize the signal-to-noise ratio of the write/read signals.

BRIEF DESCRIPTION OF THE DRAWINGS

FIG. 2A-2B show a top-down view of top and bottom transmission lines that form at least part of the interconnect, including an approximation of an inductor/capacitor ladder network, according to an embodiment of the present invention.

FIG. 2C shows a cross-section view of the stacked (top and bottom) transmission lines having a dielectric disposed between.

FIG. 2D shows a perspective view of the stacked transmission lines as well as an inductor/capacitor ladder network approximated by symmetrically varying a width of the first and second transmission lines.

FIGS. 5A-5E shows an alternative embodiment of an interconnect comprising an approximated inductor/capacitor lattice network.

DETAILED DESCRIPTION OF EMBODIMENTS OF THE INVENTION

Figure 1A:
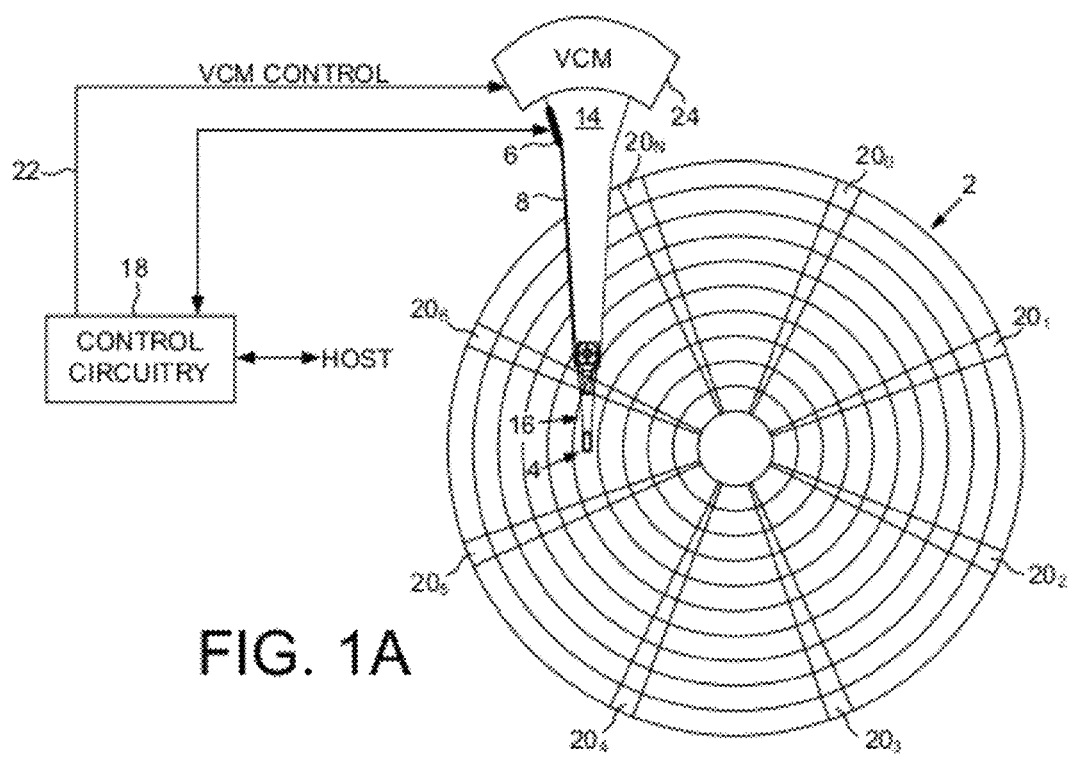
FIG. 1A shows a disk drive according to an embodiment of the present invention comprising a head actuated over a disk.
Figure 1B:
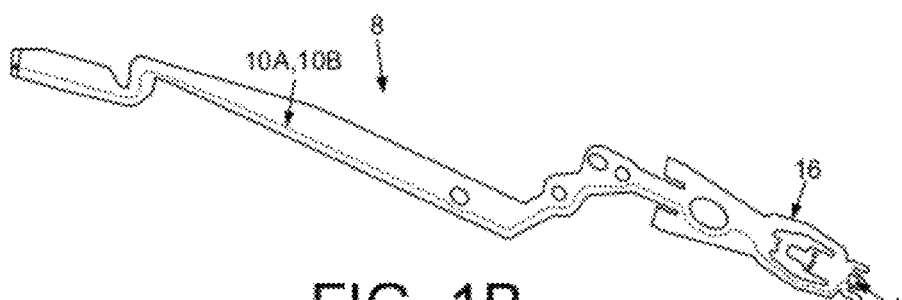
FIG. 1B shows a suspension according to an embodiment of the present invention comprising an interconnect having stacked transmission lines including a section that approximates an inductor/capacitor ladder network.

FIG. 1A shows a disk drive according to an embodiment of the present invention comprising a disk 2, a head 4 actuated over the disk 2, a preamp 6, and an interconnect 8 for coupling the head 4 to the preamp 6. The interconnect 8 comprises a first transmission line 10A stacked over a second transmission line 10B, and a dielectric 12 between the first transmission line 10A and second transmission line 10B (FIGS. 2A-2C). A shape of the first and second transmission lines 10A and 10B varies along a length of the interconnect 8 such that the interconnect 8 comprises an approximation of an inductor/capacitor ladder network (FIG. 2D).

In the embodiment of FIG. 1A, the head 4 is coupled to a distal end of an actuator arm 14 by a suspension 16 that biases the head 4 toward the surface of the disk 2. As the disk 2 spins, an air bearing forms between the head 4 and disk surface such that the head 4 is said to "fly" over the disk surface. Control circuitry 18 generates a write signal applied to the head 4 through the preamp 6 during write operations, and during read operations demodulates a read signal emanating from the head 4 through the preamp 6. The control circuitry 18 may demodulate embedded servo sectors $20_0$-$20_N$ recorded around the circumference of the disk 2 in order to generate a VCM control signal 22 applied to a voice coil motor (VCM) 24 which rotates the actuator arm 14 about a pivot in order to position the head 4 radially over the disk 2.

Any suitable head 4 may be employed in the embodiments of the present invention, such as a head 4 comprising an inductive write element and a magnetoresistive (MR) read element. A write operation is performed by modulating a write current emanating from the preamp 6 and passing through the transmission lines 10A and 10B and through the inductive write element in order to write magnetic transitions onto the disk surface. During a read operation, the read element senses the magnetic transitions to generate a read signal carried by transmission lines 10A and 10B to the preamp 6. Either or both of the write transmission lines and read transmission lines may comprise an approximated inductor/capacitor ladder network according to different embodiments of the present invention.

FIG. 2A shows a top-down view of the top transmission line 10A and FIG. 2B shows a top-down view of the bottom transmission line 10B. The transmission lines 10A and 10B may comprise any suitable conductive material, such as copper. FIG. 2C shows the transmission lines 10A and 10B in a stacked configuration having a suitable dielectric 12 (e.g., a suitable plastic) there between. Any suitable technique may be used to fabricate the stacked transmission lines 10A and 10B such as with a suitable etching technique.

In the embodiment shown in FIGS. 2A-2B, the shape of the first and second transmission lines 10A and 10B that varies comprises a width of the first and second transmission lines as illustrated in the figures. Also in the embodiment of FIGS. 2A-2B, the width of the first transmission line 10A varies symmetrically with the width of the second transmission line 10B.

FIG. 2D shows a perspective view of the stacked transmission lines 10A and 10B according to an embodiment of the present invention (the dielectric is omitted for clarity). The first transmission line 10A comprises a first segment 26A, and the second transmission line 10B comprises a second segment 26B symmetric with the first segment 26A. The first transmission line 10A comprises a third segment 28A, and the second transmission line 10B comprises a fourth segment 28B symmetric with the third segment 28A. The first segment 26A forms a first series inductance 30A, and the second segment 26B forms a second series inductance 30B. The third and fourth segments 28A and 28B form a shunt capacitance 32. In the embodiment of FIG. 2D, a width of the first and second segments 26A and 26B is less than a width of the third and fourth segments 28A and 28B in order to form the inductor and capacitor elements.

The transmission lines 10A and 10B shown in FIG. 2D comprise additional symmetrical segments of varying widths to form the remaining inductor and capacitor elements that form the approximation of the inductor/capacitor ladder network. In an embodiment shown in FIG. 3, the transmission lines 10A and 10B are fabricated such that the approximated inductor/capacitor ladder network helps to flatten a magnitude response of the interconnect 8 over a frequency band of at least one of a read signal and a write signal.

Figure 3:
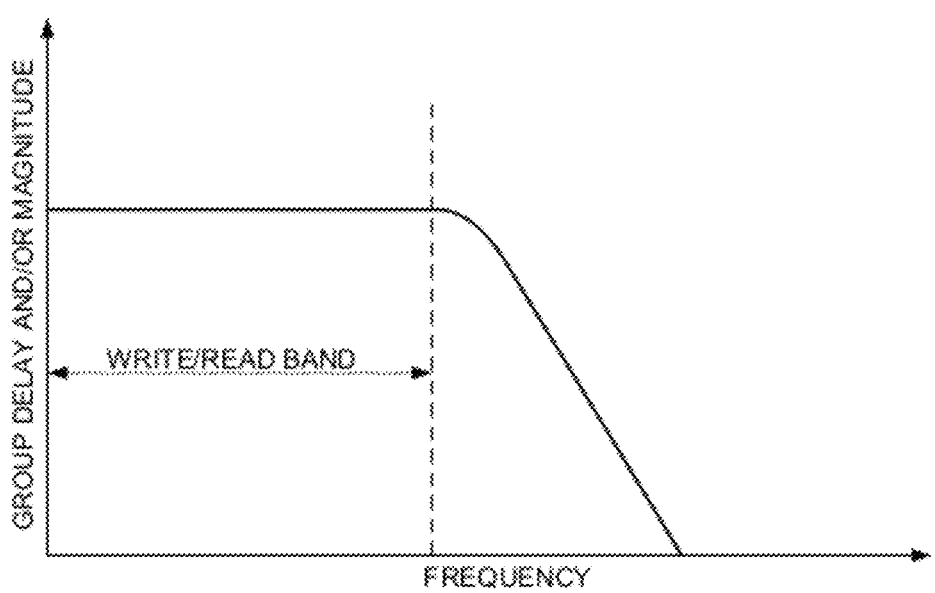
FIG. 3 shows a frequency response (group delay and magnitude) of the interconnect according to an embodiment of the present invention.
Figure 4A:
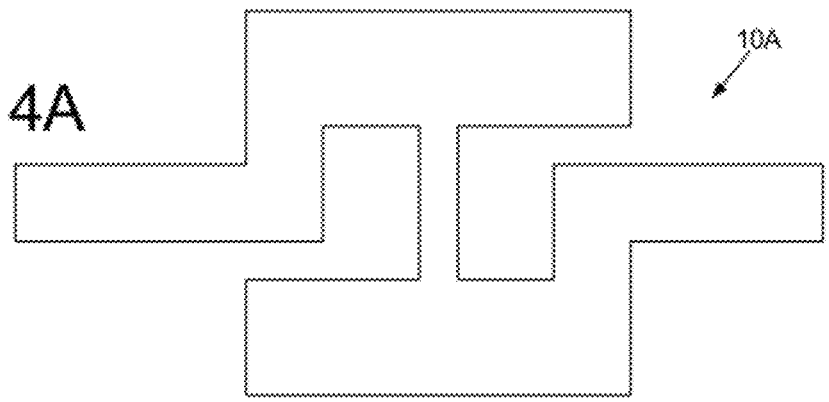
FIG. 4A-4B show a top-down view of top and bottom transmission lines that form at least part of the interconnect, including an approximation of an inductor/capacitor lattice network, according to an embodiment of the present invention.
Figure 4B:
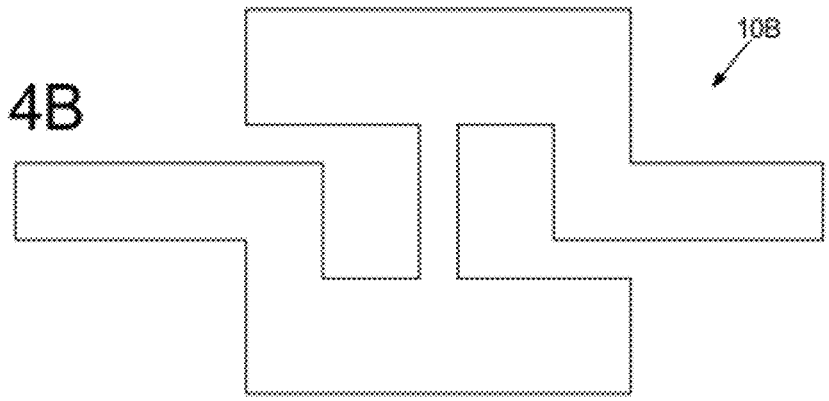
Figure 4C:
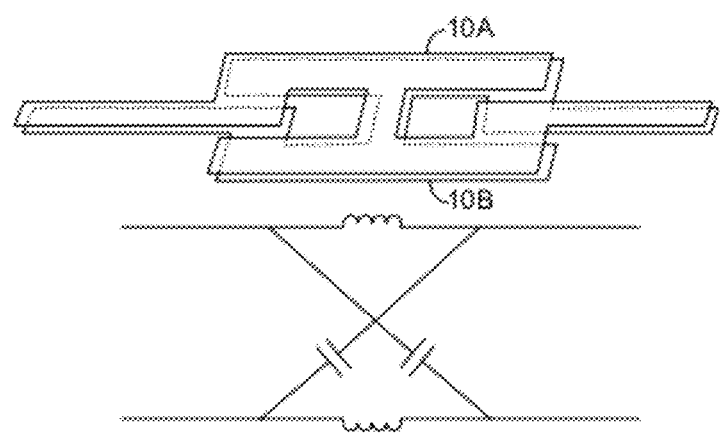
FIG. 4C shows a perspective view of the stacked transmission lines as well as an approximated inductor/capacitor lattice network.

In one embodiment, the approximated inductor/capacitor ladder network boosts the magnitude response at higher frequencies in order to flatten the magnitude response as shown in FIG. 3. However, the approximated inductor/capacitor ladder network may also distort the group delay at higher frequencies. To compensate for the group delay distortion, in an embodiment shown in FIGS. 4A-4C a shape of the first and second transmission lines 10A and 10B varies along a length of the interconnect 8 such that the interconnect comprises an approximation of an inductor/capacitor lattice network. In one embodiment, the approximated inductor/capacitor lattice network compensates for the group delay distortion by flattening the group delay as shown in the embodiment of FIG. 3.

Figure 4D:
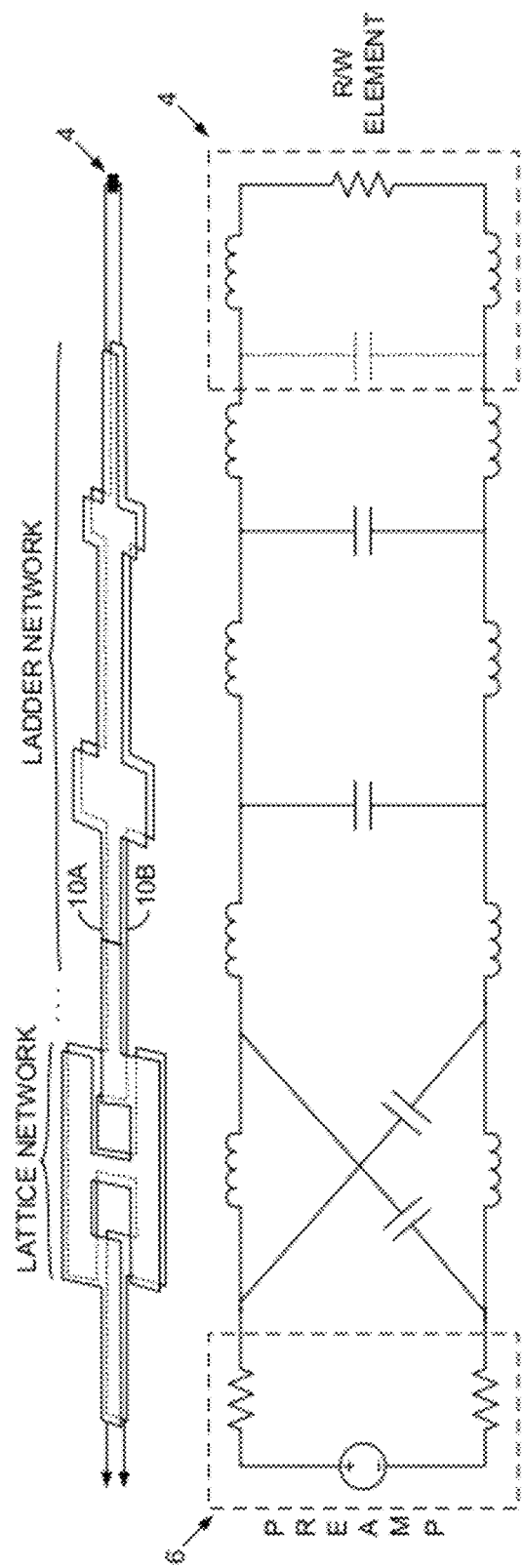
FIG. 4D shows a perspective view of the stacked transmission lines as well as an approximated inductor/capacitor lattice network and approximated inductor/capacitor ladder network.

FIG. 4D shows an embodiment of the present invention wherein the transmission lines 10A and 10B of the interconnect 8 comprise an approximated inductor/capacitor ladder network and an approximated inductor/capacitor lattice network. Any suitable length of transmission line may separate the two networks, and any suitable number of ladder networks (and optionally lattice networks) may be employed along the length of the interconnect 8. In one embodiment, the approximated inductor/capacitor ladder network is fabricated so as to substantially match an impedance of the interconnect 8 to an impedance of the read or write element in the head 4. To facilitate the impedance matching, the approximated inductor/capacitor ladder network is fabricated near the read or write element, whereas the approximated inductor/capacitor lattice network may be fabricated closer to the preamp 6.

Any suitable configuration of an interconnect for approximating an inductor/capacitor lattice network may be employed in the embodiments of the present invention. FIGS. 5A-5E show an alternative embodiment of an interconnect comprising an approximation of an inductor/capacitor lattice network. Similar to the embodiments described above, the interconnect of FIGS. 5A-5E comprises a first transmission line 10A stacked with a second transmission line 10B, and a dielectric (not shown) between the first transmission line 10A and second transmission line 10B. The inductor/capacitor lattice network comprises a first leg 34A comprising part of the first transmission line 10A stacked with part of the second transmission line 10B, wherein the transmission lines are shorted at a first end 36A of the first leg 34A and open at a second end 38A of the first leg 34A. The inductor/capacitor lattice network further comprises a second leg 34B comprising part of the first transmission line 10A stacked with part of the second transmission line 10B, wherein the transmission lines are shorted at a first end 36B of the second leg 34B and open at a second end 38B of the second leg 34B. A cross-over hub 40 (FIG. 5D) interconnects the first leg 34A and the second leg 34B, wherein as shown in the exploded view of FIG. 5C, the cross-over hub 40 connects a first bottom part 42 of the first leg 34A to a first top part 44 of the second leg 34B, and connects a second bottom part 46 of the first leg 34A to a second top part 48 of the second leg 34B. In the embodiment shown in FIG. 5C, the cross-over hub 40 employs vias (e.g., via 50) to interconnect the legs 34A and 34B, wherein each via comprise part of the transmission line conductor material flowing through an aperture in the dielectric. FIG. 5E shows an exploded view of the shorted ends 36A and 36B (FIG. 5A) of the legs 34A and 34B including vias 52A and 52B.

The configuration and interconnection of the transmission lines 10A and 10B shown in FIGS. 5A-5E for approximating the inductor/capacitor lattice network may be modified in other embodiments while still performing the desired function of a lattice network. For example, the legs 34A and 34B may be fabricated with any suitable spacing except that a sufficient spacing should be used to avoid cross-talk. In the embodiment of FIGS. 5A-5E the legs 34A and 34B are shown as being parallel to one another; however, the legs may be fabricated with any suitable configuration, such as with a star configuration. In other words, the legs 34A and 34B may be fabricated with any suitable angle with respect to the cross-over hub 40.

What is claimed is:

1. A disk drive comprising:
   a disk;
   a head actuated over the disk;
   a preamp; and
   an interconnect comprising a first transmission line stacked with a second transmission line, and a dielectric between the first transmission line and second transmission line, wherein the transmission lines form an approximation of at least one inductor/capacitor ladder network and an approximation of at least one inductor/capacitor lattice network, the inductor/capacitor lattice network comprising:
   a first leg comprising part of the first transmission line stacked with part of the second transmission line, wherein the transmission lines are shorted at a first end of the first leg and open at a second end of the first leg;
   a second leg comprising part of the first transmission line stacked with part of the second transmission line, wherein the transmission lines are shorted at a first end of the second leg and open at a second end of the second leg; and
   a cross-over hub for interconnecting the first leg and the second leg.

2. The disk drive as recited in claim 1, wherein the cross-over hub connects a first bottom part of the first leg to a first top part of the second leg.

3. The disk drive as recited in claim 2, wherein the cross-over hub connects a second bottom part of the first leg to a second top part of the second leg.

4. A suspension for use in a disk drive, the suspension comprising an interconnect comprising a first transmission line stacked with a second transmission line, and a dielectric between the first transmission line and second transmission line, wherein the transmission lines form an approximation of at least one inductor/capacitor ladder network and an approximation of at least one inductor/capacitor lattice network, the inductor/capacitor lattice network comprising:
   a first leg comprising part of the first transmission line stacked with part of the second transmission line, wherein the transmission lines are shorted at a first end of the first leg and open at a second end of the first leg;
   a second leg comprising part of the first transmission line stacked with part of the second transmission line, wherein the transmission lines are shorted at a first end of the second leg and open at a second end of the second leg; and
   a cross-over hub for interconnecting the first leg and the second leg.

5. The suspension as recited in claim 4, wherein the cross-over hub connects a first bottom part of the first leg to a first top part of the second leg.

6. The disk drive as recited in claim 5, wherein the cross-over hub connects a second bottom part of the first leg to a second top part of the second leg.

* * * * *